(12) United States Patent
Lehtola

(10) Patent No.: US 10,044,398 B2
(45) Date of Patent: *Aug. 7, 2018

(54) CASCODE AMPLIFIER SEGMENTATION FOR ENHANCED THERMAL RUGGEDNESS

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/596,331

(22) Filed: May 16, 2017

(65) Prior Publication Data

US 2017/0250727 A1    Aug. 31, 2017

Related U.S. Application Data

(63) Continuation of application No. 14/860,971, filed on Sep. 22, 2015, now Pat. No. 9,654,155.

(Continued)

(51) Int. Cl.

| H04B 1/38 | (2015.01) |
| H04B 1/40 | (2015.01) |
| H03F 1/52 | (2006.01) |
| H03F 3/19 | (2006.01) |
| H03F 3/24 | (2006.01) |

(Continued)

(52) U.S. Cl.
CPC ............... *H04B 1/40* (2013.01); *H03F 1/22* (2013.01); *H03F 1/52* (2013.01); *H03F 3/19* (2013.01); *H03F 3/245* (2013.01); *H03F 1/0288* (2013.01); *H03F 2200/451* (2013.01); *H04B 2001/0408* (2013.01)

(58) Field of Classification Search
CPC .... H03F 2200/451; H03F 3/211; H03F 1/302; H03F 3/189; H03F 3/3432; H03F 3/4508; H03F 2200/408; H03F 3/42; H03F 2203/45051; H03F 2203/45366; H03F 2203/45371; H03G 1/0023; H03G 1/0082; H01L 21/8222; H01L 29/737; H04B 2001/0408

See application file for complete search history.

(56) References Cited

U.S. PATENT DOCUMENTS

| 5,066,926 A * | 11/1991 | Ramachandran | ......... H03F 1/22 |
| | | | 330/124 R |
| 7,961,052 B2 * | 6/2011 | Bacon | ..................... H03F 3/195 |
| | | | 330/307 |

(Continued)

*Primary Examiner* — Rahel Guarino
(74) *Attorney, Agent, or Firm* — Chang & Hale LLP

(57) ABSTRACT

According to some implementation, a power amplifier includes a plurality of pairs of transistors, each pair of transistors including a common emitter transistor and a common base transistor arranged in a cascode configuration. The power amplifier further includes electrical connections implemented to connect the plurality of pairs in a parallel configuration between an input node and an output node. According to some implementations, the electrical connections are configured to distribute a collector current to all of the common base transistors to thereby reduce likelihood of damage to one or more common base transistors during a thermal run-away event.

17 Claims, 15 Drawing Sheets

Related U.S. Application Data

(60) Provisional application No. 62/116,508, filed on Feb. 15, 2015.

(51) Int. Cl.
*H03F 1/22* (2006.01)
*H04B 1/04* (2006.01)
*H03F 1/02* (2006.01)

(56) References Cited

U.S. PATENT DOCUMENTS

| | | | |
|---|---|---|---|
| 9,654,155 B2 * | 5/2017 | Lehtola | H04B 1/0475 |
| 2014/0077883 A1 * | 3/2014 | Griffith | H01L 23/481 |
| | | | 330/296 |

* cited by examiner

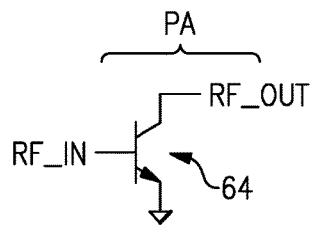
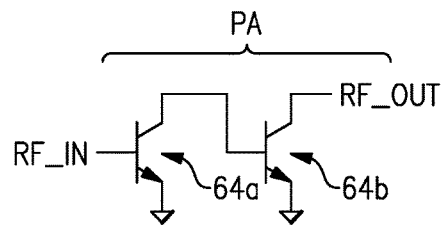
FIG.3A  FIG.3B
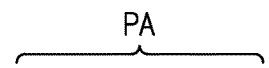
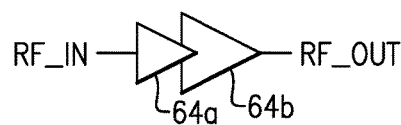
FIG.3C
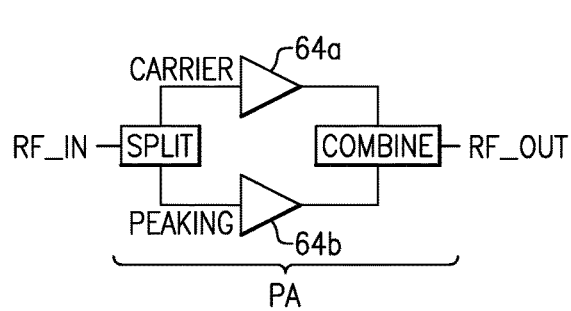
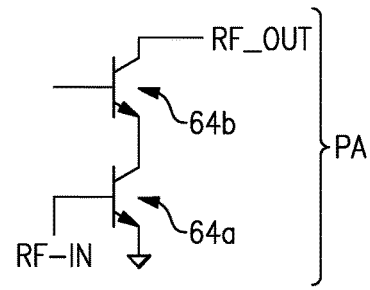
FIG.3D  FIG.3E

CASCODE AMPLIFIER SEGMENTATION FOR ENHANCED THERMAL RUGGEDNESS

CROSS-REFERENCE TO RELATED APPLICATION(S)

This application is a continuation of U.S. application Ser. No. 14/860,971 filed Sep. 22, 2015, entitled CASCODE AMPLIFIER SEGMENTATION FOR ENHANCED THERMAL RUGGEDNESS, which claims priority to U.S. Provisional Application No. 62/116,508 filed Feb. 15, 2015, entitled CASCODE AMPLIFIER SEGMENTATION FOR ENHANCED THERMAL RUGGEDNESS, the disclosure of which is hereby expressly incorporated by reference herein in its entirety.

BACKGROUND

Field

The present disclosure relates to power amplifiers in radio-frequency (RF) applications.

Description of the Related Art

Many devices, such as wireless devices, require or utilize a cascode amplifier structure to decouple performance-degrading thermal protection solutions from high performance radio-frequency (RF) power array elements.

In some applications, thermal ruggedness can be built into an array by increasing distances between devices in the power array, and by through ballasting techniques. Such techniques can introduce local feedback at each of the devices within the power array.

Spreading of the array can reduce the heating of adjacent array elements and can effectively reduce the thermal resistance of the array to heat sinking structures. Such a technique can result in an increased area for the array, and can also increase the corresponding die size and cost.

Ballasting techniques are often in the form of emitter degeneration or base degeneration. These solutions can introduce loss in the RF signal path which can degrade gain, efficiency and saturated power, thereby reducing performing. Other solutions which utilize a cascode architecture may include a common connection of the cascode emitters, which typically involves ballasting of the cascode devices to prevent thermal run-away.

SUMMARY

In accordance with a number of implementations, the present disclosure relates to a power amplifier including a plurality of pairs of transistors, each pair of transistors including a common emitter transistor and a common base transistor arranged in a cascode configuration. The power amplifier further includes electrical connections implemented to connect the plurality of pairs in a parallel configuration between an input node and an output node, the electrical connections configured to distribute a collector current to all of the common base transistors to thereby reduce likelihood of damage to one or more common base transistors during a thermal run-away event.

In some implementations, for each of the plurality of pairs of transistors, the emitter of the common emitter transistor is coupled to the base of the common base transistor through a bypass capacitance.

In some implementations, for each of the plurality of pairs of transistors, the base of the common emitter transistor is coupled to an input bias circuit. In some implementations, the input bias circuit includes a radio-frequency (RF) ballast resistance. In some implementations, the input bias circuits of the plurality of pairs of transistors are coupled a common RF input.

In some implementations, for each of the plurality of pairs of transistors, the emitter of the common emitter transistor is coupled to a ground potential.

In some implementations, for each of the plurality of pairs of transistors, the base of the common base transistor is coupled to a cascode bias circuit. In some implementations, the cascode bias circuit includes a cascode ballast resistance.

In some implementations, for each of the plurality of pairs of transistors, the collector of the common base transistor is coupled to a supply voltage.

In some implementations, the collectors of the common base transistors of the plurality of pairs of transistors are coupled to yield a common RF output.

In some implementations, the present disclosure relates to a radio-frequency (RF) module that includes a packaging substrate configured to receive a plurality of components. The RF module further includes a power amplification system implemented on the packaging substrate, the power amplification system including a power amplifier (PA) configured to receive and amplify an RF signal. The PA includes a plurality of pairs of transistors, each pair of transistors including a common emitter transistor and a common base transistor arranged in a cascode configuration. The PA further includes electrical connections implemented to connect the plurality of pairs in a parallel configuration between an input node and an output node, the electrical connections configured to distribute a collector current to all of the common base transistors to thereby reduce likelihood of damage to one or more common base transistors during a thermal run-away event.

In accordance with some implementations, the PA of the RF module includes the functions and/or features of any of the PAs and/or amplification systems described herein.

According to some teachings, the present disclosure relates to a radio-frequency (RF) device that includes a transceiver generate to an RF signal. The RF device also includes a front-end module (FEM) in communication with the transceiver, the FEM includes a packaging substrate configured to receive a plurality of components. The FEM further includes a power amplifier (PA) configured to and amplify the RF signal. The PA includes a plurality of pairs of transistors, each pair of transistors including a common emitter transistor and a common base transistor arranged in a cascode configuration. The PA further includes electrical connections implemented to connect the plurality of pairs in a parallel configuration between an input node and an output node, the electrical connections configured to distribute a collector current to all of the common base transistors to thereby reduce likelihood of damage to one or more common base transistors during a thermal run-away event. THE RF device further includes an antenna in communication with the FEM, the antenna configured to transmit the amplified RF signal.

In some implementations, the RF device includes a wireless device. In some implementations, the wireless device is a cellular phone.

In accordance with some implementations, the PA of the FEM module includes the functions and/or features of any of the PAs and/or amplification systems described herein.

For purposes of summarizing the disclosure, certain aspects, advantages and novel features of the inventions have been described herein. It is to be understood that not necessarily all such advantages may be achieved in accordance with any particular embodiment of the invention.

Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 3A-3E shows schematic diagrams of power amplifiers according to some implementations.

Figure 1:
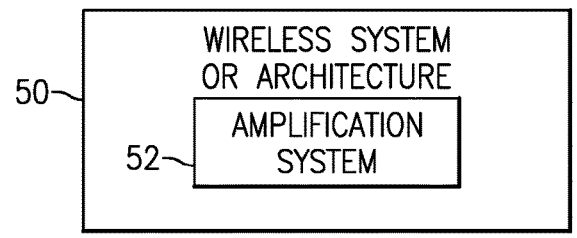
FIG. 1 is a block diagram of a wireless system or architecture according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
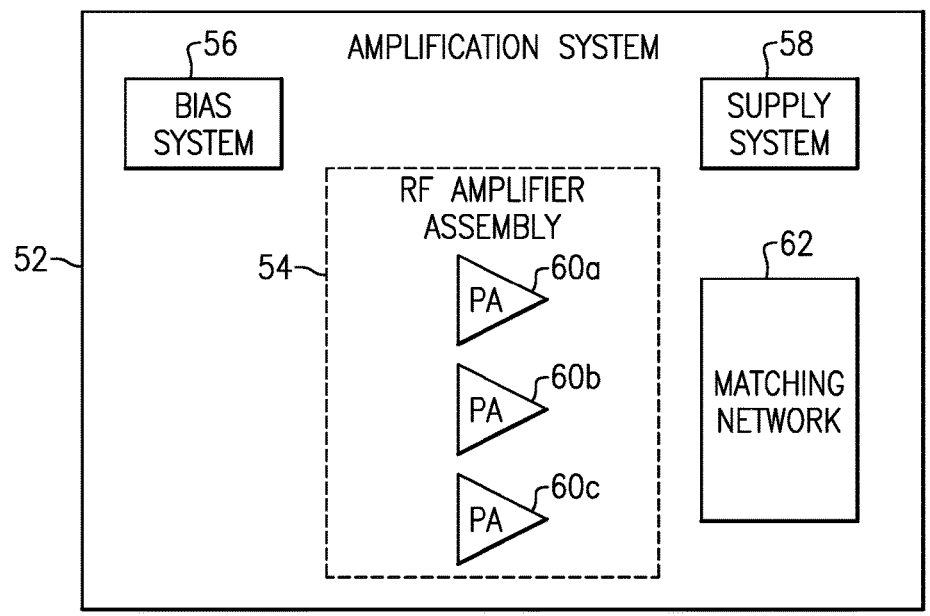
FIG. 2 is a block diagram of an amplification system according to some implementations.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
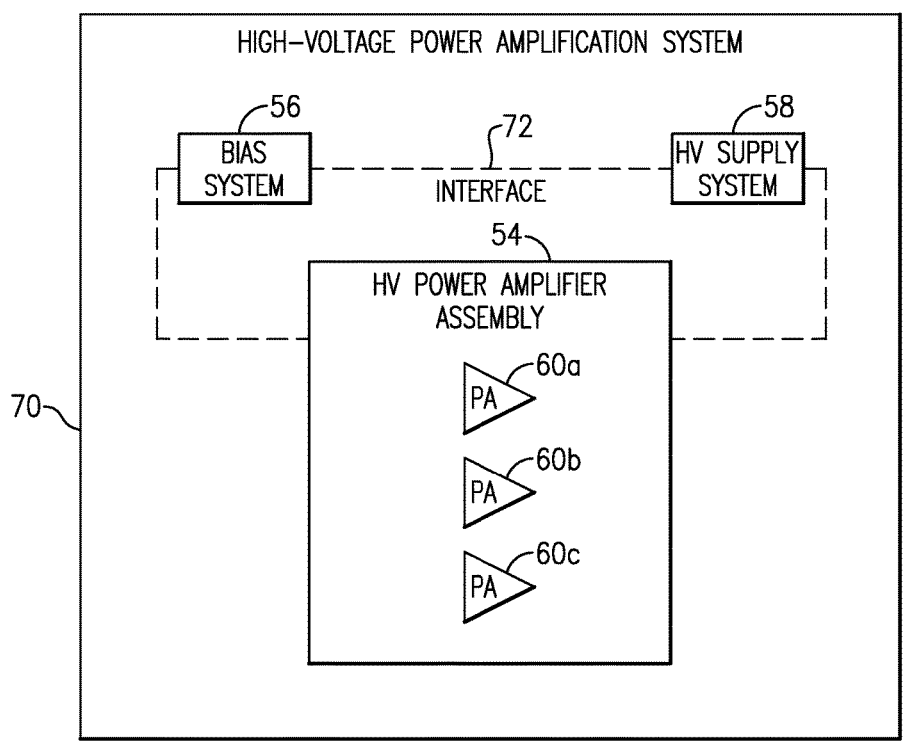
FIG. 4 is a block diagram of an amplification system according to some implementations.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

A power amplifier (PA) often includes an output power array having multiple semiconductor devices operating in parallel. While it is desirable to have each of the individual devices operate at exactly the same condition, imperfections between devices, as well as temperature gradients across the array, can cause variations in their operating points. Under extreme conditions, one of the devices may thermally run-away causing the power array to collapse, and thereby resulting in permanent failure. Such a problem becomes more complex when operating at high supply voltages since more power dissipation is introduced in the array.

Described herein are examples related to use of a cascode amplifier structure to decouple performance-degrading thermal protection solutions from high performance radio-frequency (RF) power array elements.

In some applications, thermal ruggedness can be built into an array by increasing distances between devices in the power array, and by through ballasting techniques. Such techniques can introduce local feedback at each of the devices within the power array.

Spreading of the array can reduce the heating of adjacent array elements and can effectively reduce the thermal resistance of the array to heat sinking structures. Such a technique can result in an increased area for the array, and can also increase the corresponding die size and cost.

Ballasting techniques are often in the form of emitter degeneration or base degeneration. These solutions can introduce loss in the RF signal path which can degrade gain, efficiency and saturated power, thereby reducing performing. Other solutions which utilize a cascode architecture may include a common connection of the cascode emitters, which typically involves ballasting of the cascode devices to prevent thermal run-away.

Described herein are one or more features related to cascode PA architectures that can operate at higher supply voltages. Such higher supply voltage operation can compound thermal issues, since the power per unit area tends to increase with increasing voltage. Taking advantage of the higher supply voltage, a cascode PA architecture can be segmented such that each individual power array element has an isolated connection to its associated cascode element. The resulting structure can force a majority of the supply voltage and power dissipation across the cascode element, and can reduce the maximum voltage across the RF power device to, for example, less than 1V. The low voltage across the RF device can reduce or eliminate the requirement for ballasting, while the individual connection of the cascode device can provide self-ballasting functionality for the cascode array to thereby prevent or reduce thermal run-away.

In some embodiments, a cascode PA architecture having one or more features as described herein can be implemented so as to reduce the array footprint of a power array while maintaining high gain. Since the high power dissipation is placed across the cascode device which is self-ballasted due to the individual connections, these devices can be placed closer together than other configurations, and yet require less ballasting of the RF array devices.

Figure 5A:
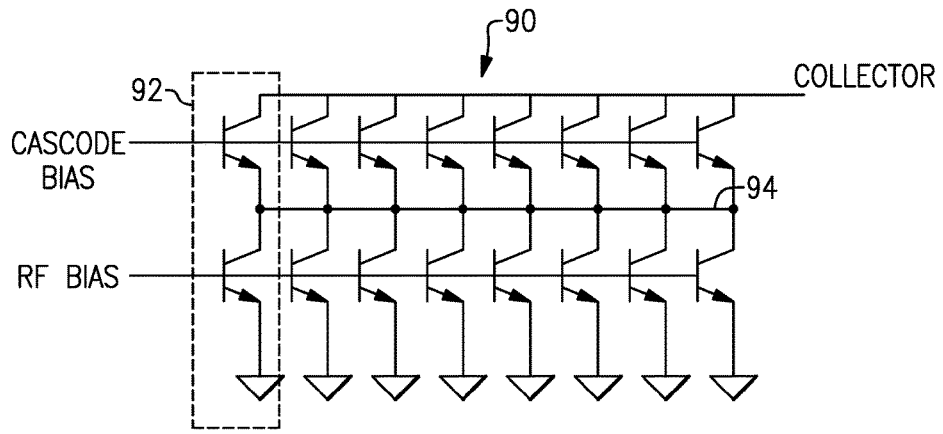
FIG. 5A is a schematic diagram of an array of cascoded devices according to some implementations.

FIG. 5A shows an example array 90 in which a plurality of cascoded devices 92 are arranged in parallel, and having ballasting of cascode segments and increased ballasting of RF array to prevent current crowding and thermal run-away. Such a configuration results in the cascoded devices being coupled as indicated by 94.

Figure 5B:
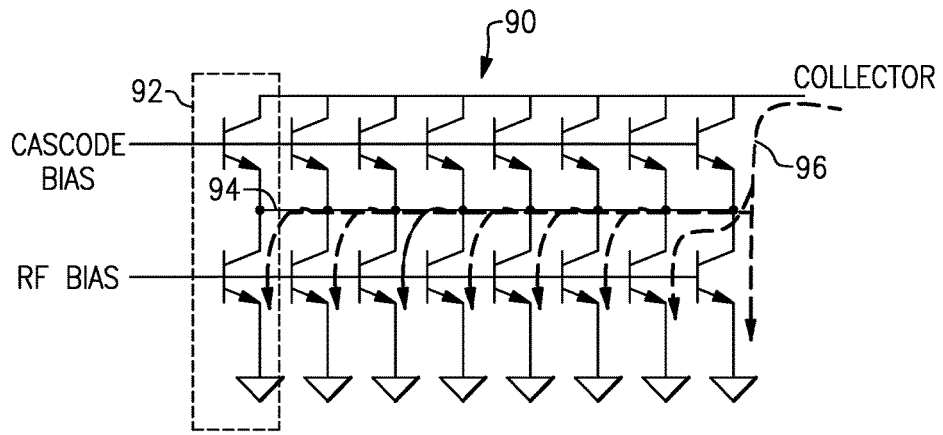
FIG. 5B shows an example collector current path through the array of cascoded devices in FIG. 5A according to some implementations.

FIG. 5B shows the same example array 90 of FIG. 5A. In FIG. 5B, an example collector current path 96 is depicted. Such a collector current can be experienced during a thermal run-away event. In such an event, substantially all of the collector current could go through a single common base transistor (e.g., the upper right transistor), thereby damaging the transistor.

Figure 6:
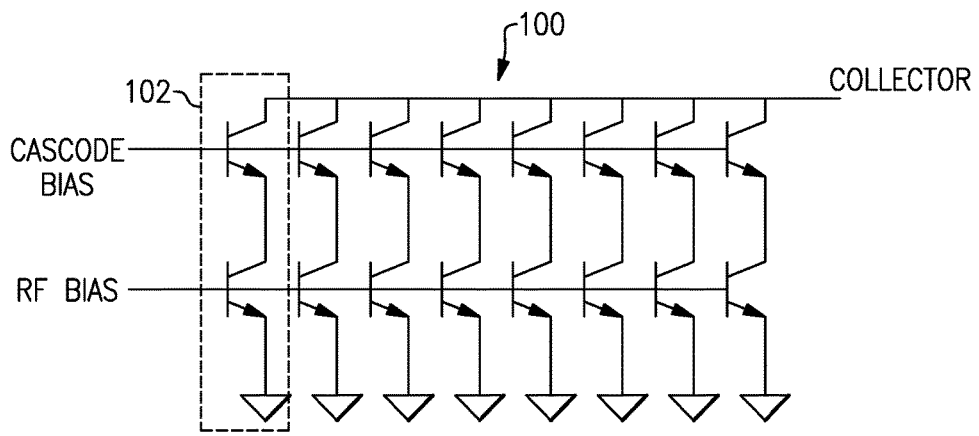
FIG. 6 is a schematic diagram of an isolated cascode array according to some implementations.

FIG. 6 shows an example of an isolated cascode array 100 that can be configured to force more even distribution of collector current across all of the common base transistors. Accordingly, likelihood of damage can be reduced or eliminated during a thermal run-away event.

Figure 7:
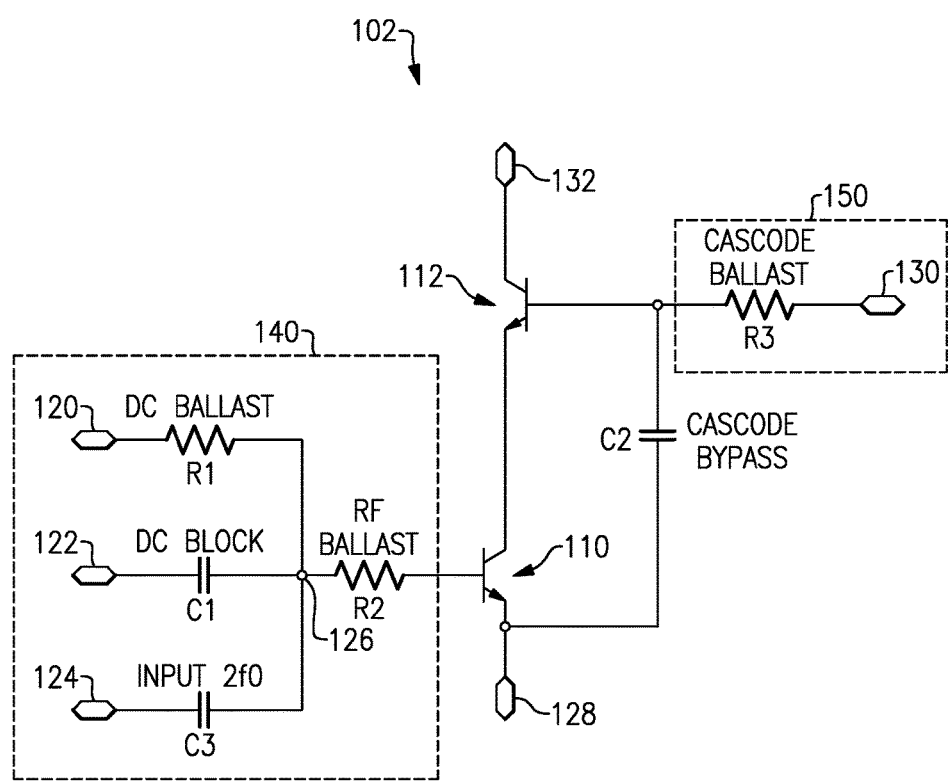
FIG. 7 is a schematic diagram of a cascoded device according to some implementations.
Figure 8:
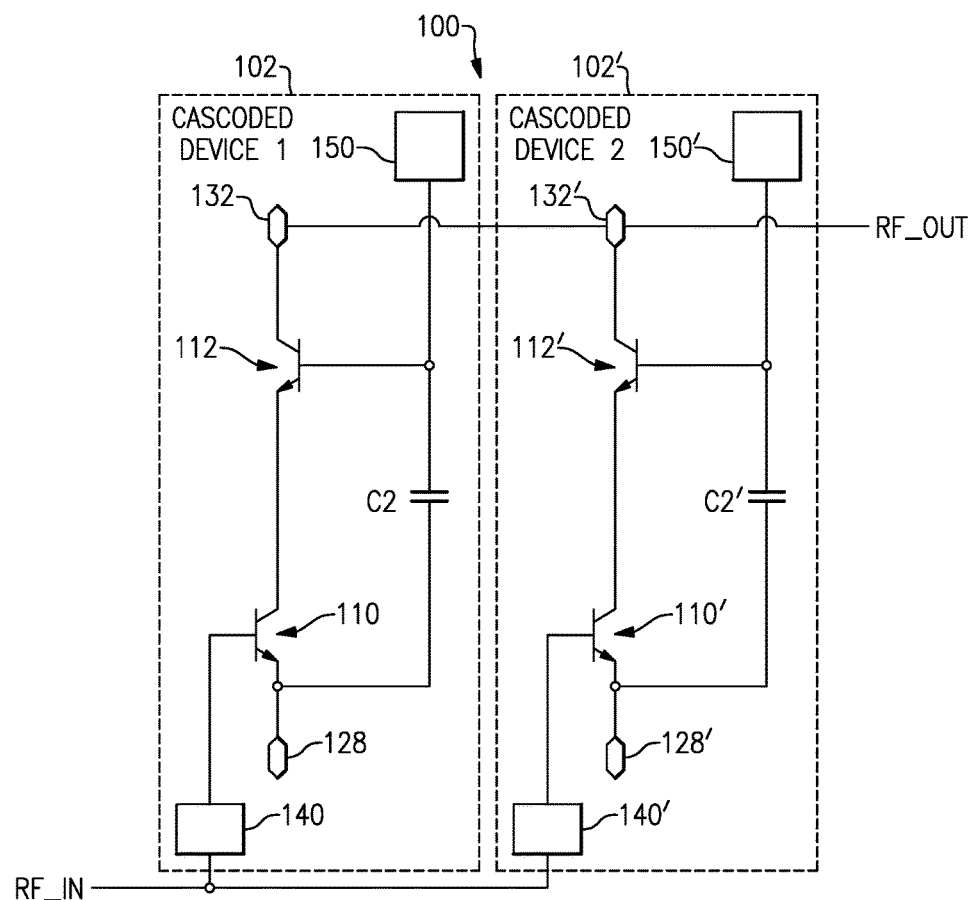
FIG. 8 is a schematic diagram of an array of two cascoded devices according to some implementations.

In FIG. 6, each cascoded device is indicated as 102. FIG. 7 shows a more detailed example of such a cascoded device, and FIG. 8 shows how a plurality of such cascoded devices can be arranged so as to form an array.

In the example of FIG. 7, a cascoded device 102 is shown to include a common emitter (CE) device 110 (also referred to herein as an RF transistor) coupled to a common base (CB) device 112 (also referred to herein as a cascode transistor). The emitter of the RF transistor 110 is shown to be coupled to the base of the cascode transistor 112 through a cascode bypass capacitance C2.

The base of the RF transistor 110 is shown to be coupled to an RF ballast resistance R2. In turn, the RF ballast resistance R2 is coupled to a node 126. A bias input 120, an RF input 122, and a second harmonic input 124 are coupled in parallel with node 126. As shown in FIG. 7, the bias input 120 is coupled to the node 126 through DC ballast resistance R1, the RF input 122 is coupled to the node 126 through DC block capacitance C1, and the second harmonic input 124 is coupled to the node 126 through the capacitance C3. R1, C1, C3, the node 126, R2, and inputs 120, 122, 124 are collectively referred to as an input bias circuit 140 for ease of reference.

The base of the cascode transistor 112 is shown to be coupled to a bias input 130 in series with a cascode ballast resistance 148, which are collectively referred to as a cascode bias circuit 150 for ease of reference. The emitter of the RF transistor 110 can be coupled to ground 128, and the collector of the cascode transistor 112 can be coupled to a supply voltage node 132.

FIG. 8 shows an example of an array 100 having two cascoded devices 102, 102' arranged so as to provide isolation property. Each cascoded device is similar to the example of FIG. 7. It will be understood that more than two cascoded devices can be arranged in a similar manner.

In the example array 100 of FIG. 8, each cascoded device can include its own bias circuits for the RF transistor and the cascode transistor. More particularly, the RF transistor 110 of the first cascoded device 102 is shown to have a input bias circuit 140 coupled to its base, and the cascode transistor 112 is shown to have a cascode bias circuit 150 coupled to its base. Similarly, the RF transistor 110' of the second cascoded device 102' is shown to have an input bias circuit 140' coupled to its base, and the cascode transistor 112' is shown to have a cascode bias circuit 150' coupled to its base.

In the example of FIG. 8, at least some portions of the input bias circuits 140, 140' can be coupled to facilitate, for example, a common RF input. Similarly, the collectors 132, 132' of the cascode transistors 112, 112' can be coupled to yield a common RF output, and to receive a common supply voltage.

In some embodiments, the array of cascoded devices of FIG. 8 can be implemented so as to yield isolated connections between the parallel elements. For example, the array can be built with a plurality of CE (110)/CB (112) pairs, instead of building a separate CE array and a separate CB array.

Figure 9:
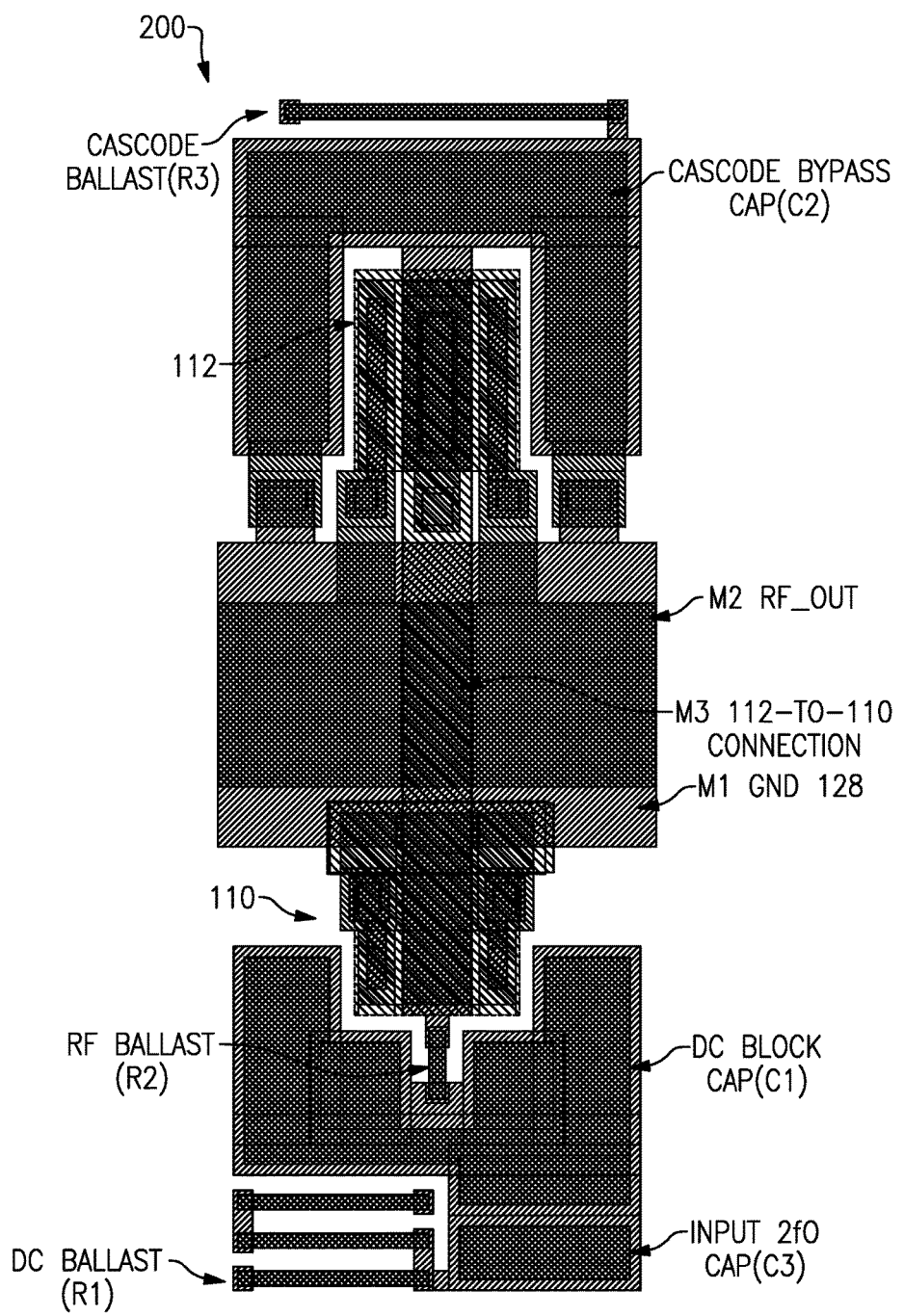
FIG. 9 is an example layout of a common emitter (CE)/common base (CB) pair and related connections forming a cascoded device according to some implementations.

FIG. 9 shows an example layout 200 of a CE/CB pair and related connections to form a cascoded device. The example layout 200 is similar and adapted from the example of the cascoded device 102 in FIG. 7. Such a pair, when combined with other pair(s), can yield the foregoing isolation functionality. Various parts and connections are shown and/or indicated in FIG. 9. It will be understood that the layout 200 is only an example; and that other layouts can be implemented.

Figure 10:
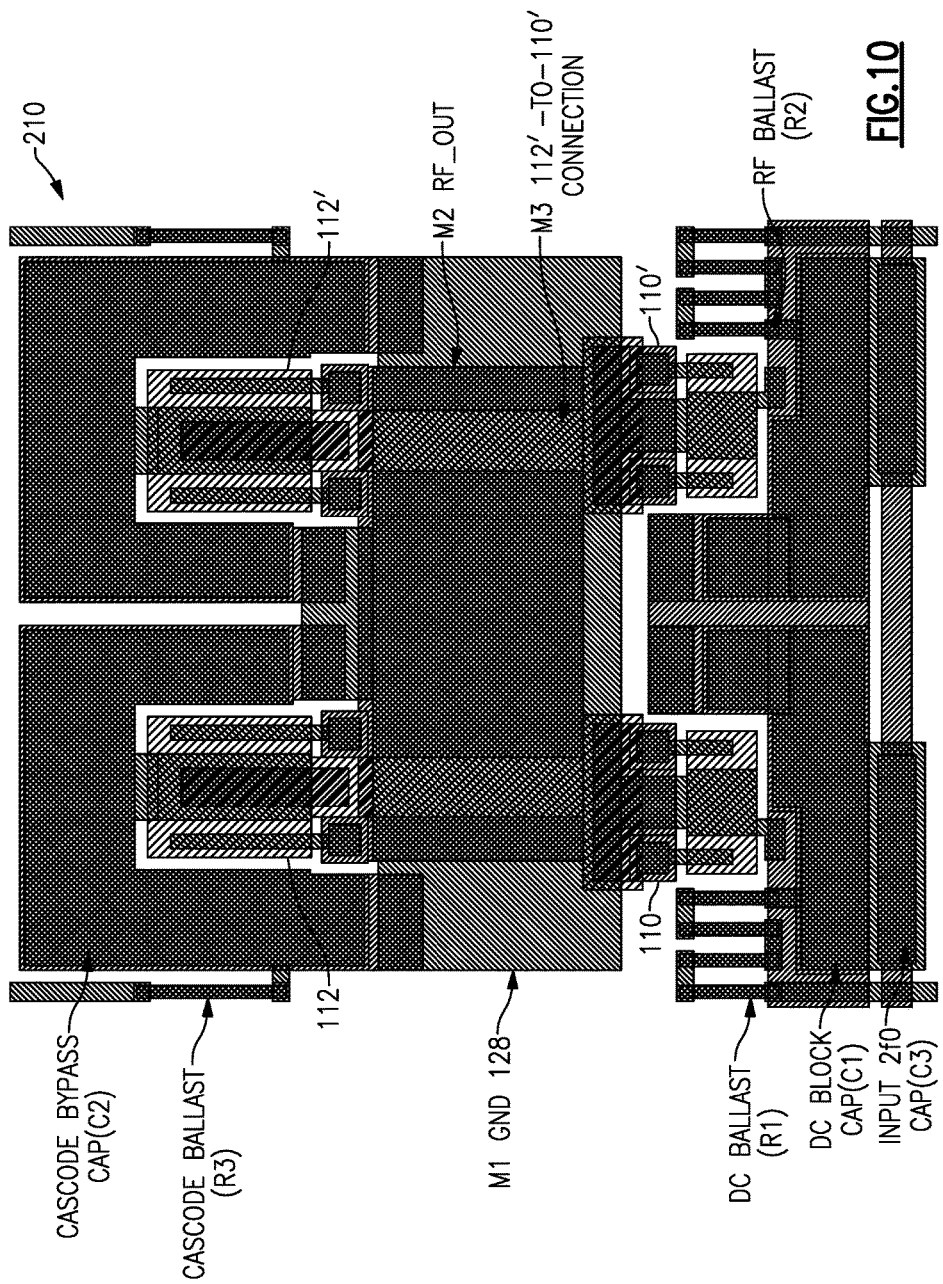
FIG. 10 is an example layout of two CE/CB pairs and related connections forming cascoded devices according to some implementations.

FIG. 10 shows an example layout 210 of two CE/CB pairs and related connections to form cascoded devices similar to the example of FIG. 8. The example layout 210 is similar and adapted from the example of the array 100 of two cascoded devices 102, 102' in FIG. 8. As shown in FIG. 10, the two CE/CB pairs are combined in parallel similar to the cascoded devices 102, 102' in FIG. 8. Various parts and connections are shown and/or indicated in FIG. 10. It will be understood that the layout 210 is only an example; and that other layouts can be implemented.

Figure 11:
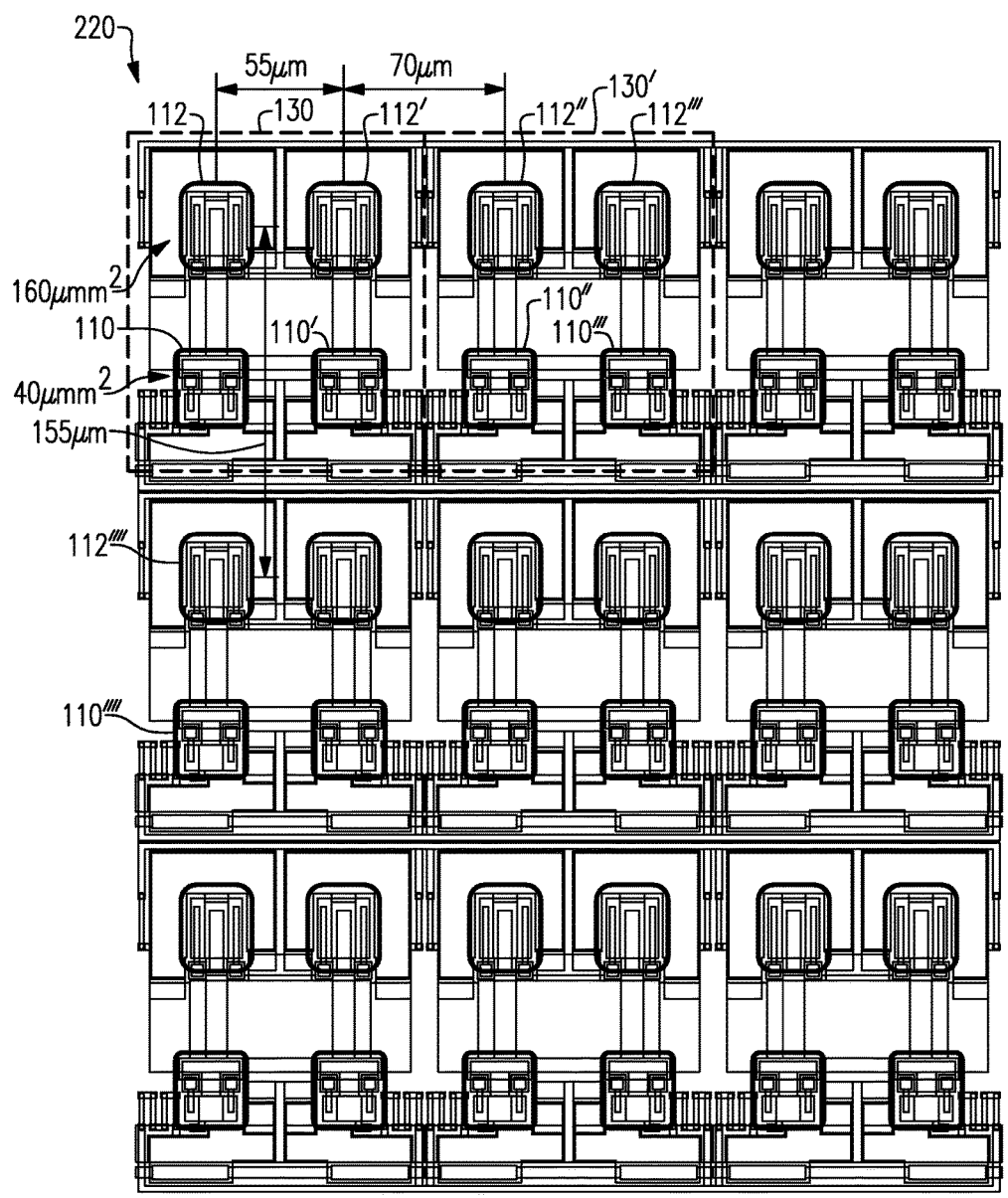
FIG. 11 is an example layout of CE/CB pairs in a two-dimensional array according to some implementations.

FIG. 11 shows an example layout 220 in which 18 CE/CB pairs are arranged in a two-dimensional array and electrically connected in parallel. In the example shown, some of the CB transistors (112), which are the higher power devices, and the CE transistors (110) are highlighted. As shown in FIG. 11, a first CE/CB including CB 112 and CE 110 is combined in parallel to a second CE/CB pair including CB 112' and CE 110' in a region 130. Similarly, a third CE/CB pair including CB 112" and CE 110" is combined in parallel to a fourth CE/CB pair including CB 112''' and CE 110''' in a region 130'.

In the example of FIG. 11, the area occupied by CB transistor 112 is 160 $\mu m^2$, and the area occupied by CE transistor 110 is 40 $\mu m^2$. In the example of FIG. 11, the distance between the centers of CB 112 and CB 112' in region 130 is 55 $\mu m$, and the distance between the center of CB 112' in region 130 and the center of CB 112" in region 130' is 70 $\mu m$. In the example of FIG. 11, the distance between the centers of CB 112 and CB 112''' is 155 $\mu m$. It will be understood that various values are examples only; and that other values can be implemented. It will also be understood that other numbers of pairs and other two-dimensional combinations can be implemented.

Figure 12:
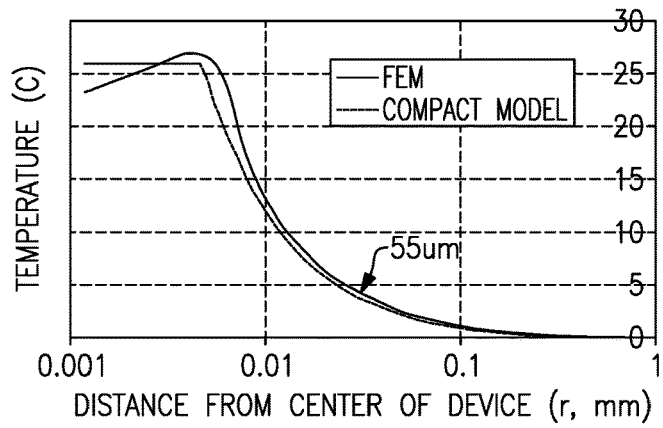
FIG. 12 shows temperature-rise curves as a function of device spacing according to some implementations.

FIG. 12 shows temperature-rise curves as a function of device spacing. At the closest device spacing of about 55 $\mu m$ (in FIG. 11), the temperature increase is shown to be about 4° C. The curves in FIG. 12 assumes 3000 $\mu W/\mu m^2$ power dissipation density in a cascode device. Actual power dissipation density in the cascode device is about 200 $\mu W/\mu m^2$; accordingly, the temperature increase is expected to be even less.

Figure 13:
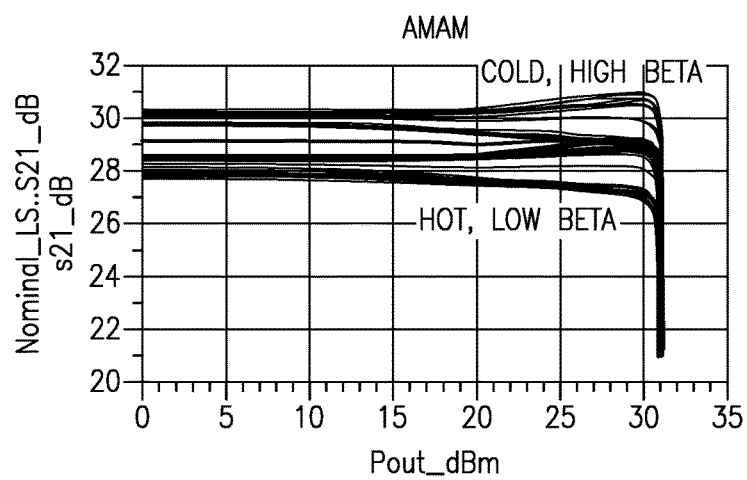
FIG. 13 shows amplitude-to-amplitude (AM-AM) distortion performance plots at various operating conditions according to some implementations.
Figure 14:
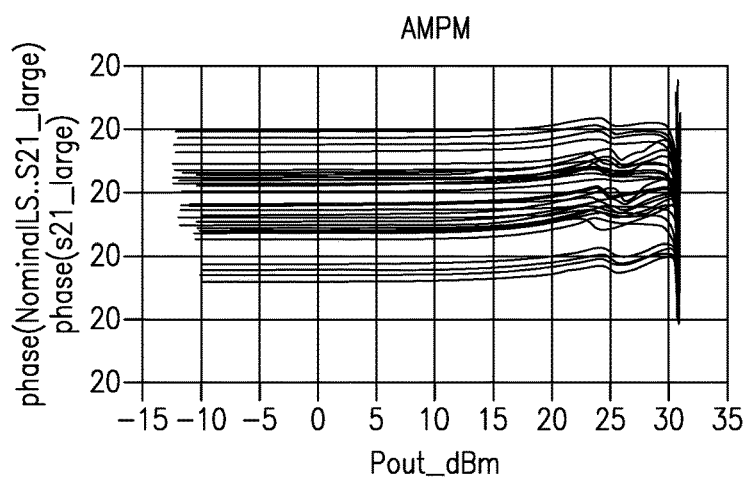
FIG. 14 shows amplitude-to-phase (AM-PM) distortion performance plots at various operating conditions according to some implementations.
Figure 15:
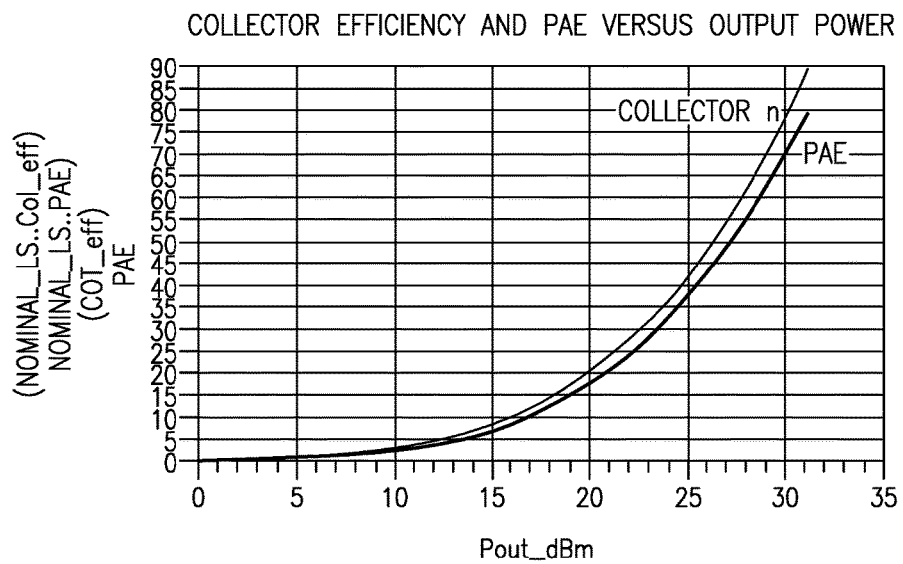
FIG. 15 shows performance plots of collector efficiency versus output power and power added efficient versus out power at various operating conditions according to some implementations.
Figure 16:
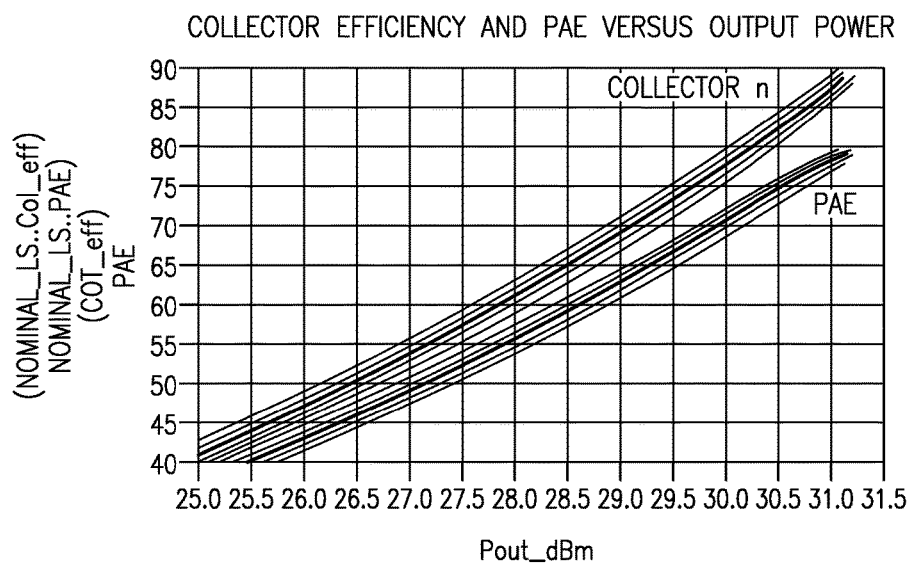
FIG. 16 shows an enlarged view of the performance plots in FIG. 15 according to some implementations.
Figure 17:
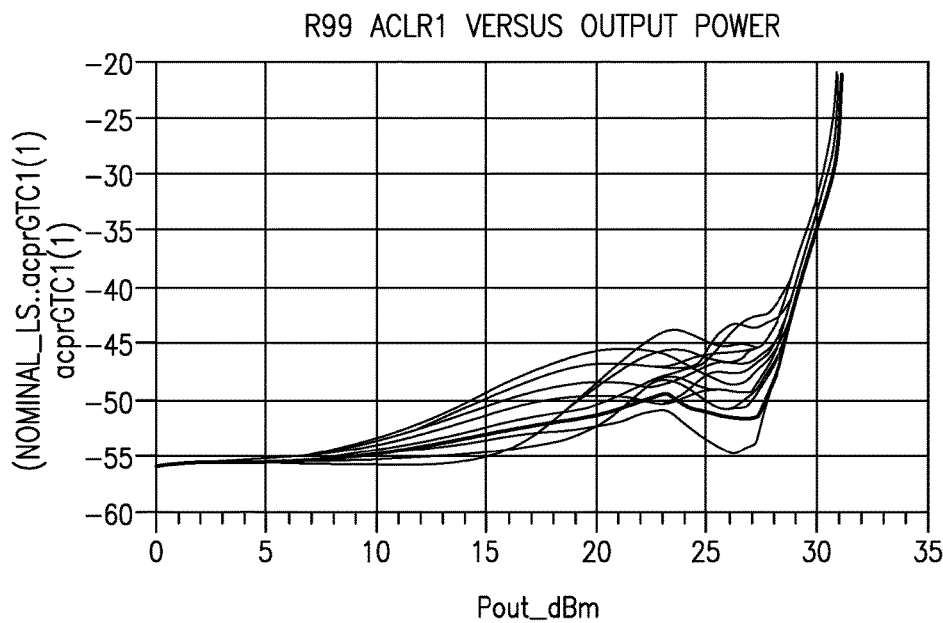
FIG. 17 shows performance plots of adjusted channel leakage ratio (ACLR1) curves as a function of output power according to some implementations.
Figure 18:
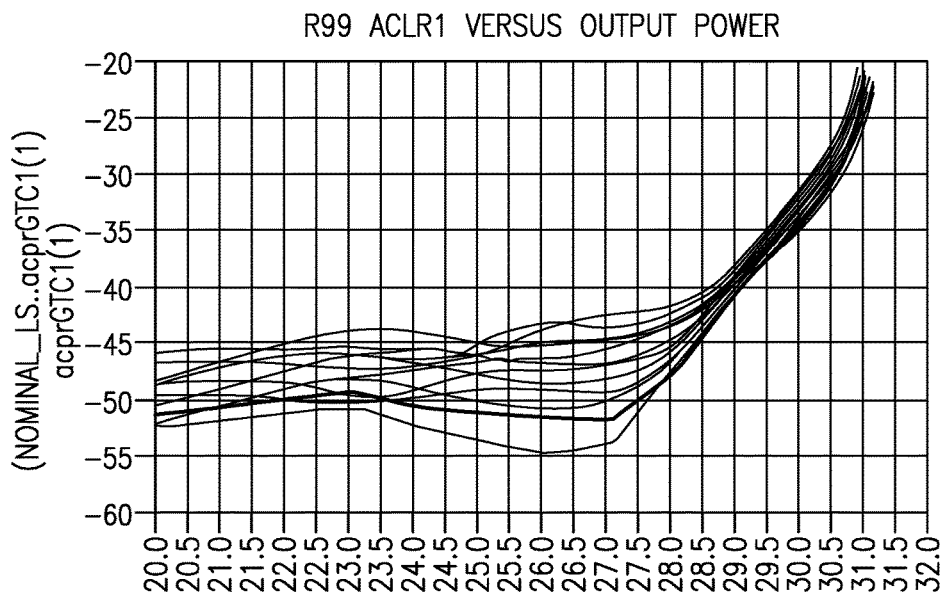
FIG. 18 shows an enlarged view of the performance plots in FIG. 17 according to some implementations.
Figure 19:
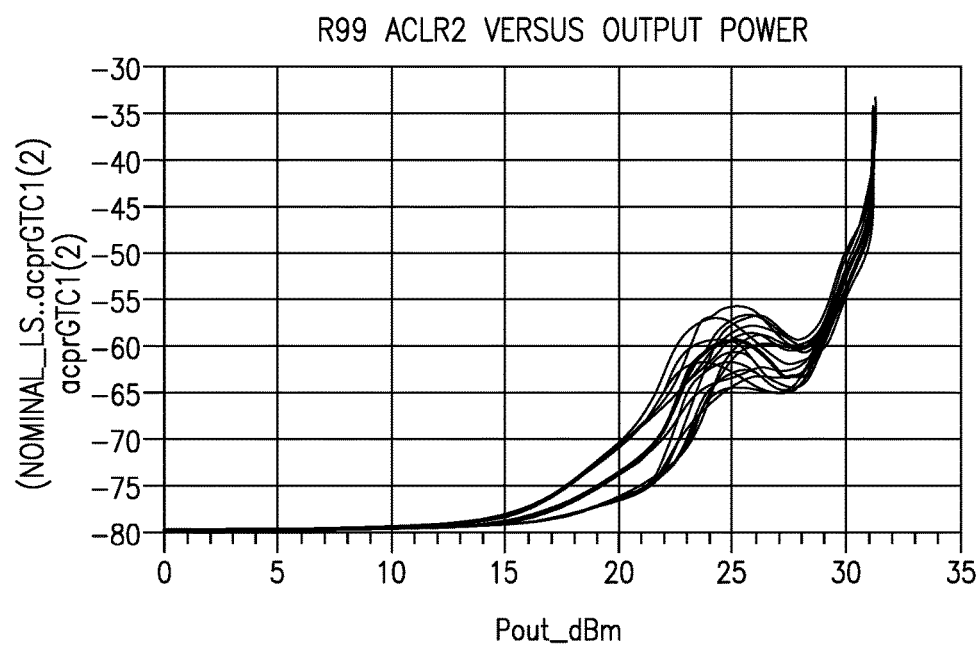
FIG. 19 shows performance plots of ACLR2 curves as a function of output power according to some implementations.

FIGS. 13 and 14 show performance plots of amplitude-to-amplitude (AM-AM) distortion and amplitude-to-phase (AM-PM) distortion, respectively, at various operating conditions of the array of cascoded devices. FIG. 15 shows performance plots of collector efficiency and power added efficiency (PAE) as a function of output power at similar operating conditions of the array of cascoded devices. FIG. 16 shows an enlarged view of the performance plots of FIG. 15. FIG. 17 shows performance plots of adjusted channel leakage ratio 1 (ACLR1) as a function of output power at similar operating conditions of the array of cascoded devices. FIG. 18 shows an enlarged view of the performance plots of FIG. 17. FIG. 19 shows performance plots of ACLR2 as a function of output power at similar operating conditions of the array of cascoded devices. For the foregoing plots in FIGS. 13-19, the example array of cascoded devices is operated with a supply voltage of approximately 10V.

Figure 20:
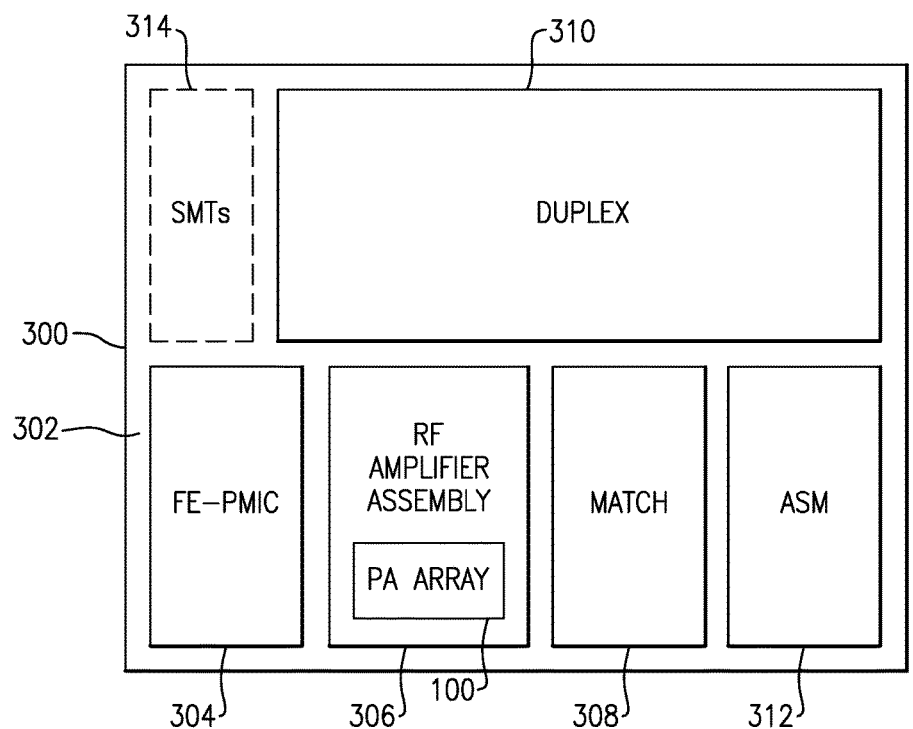
FIG. 20 is a schematic diagram of an example radio-frequency (RF) module according to some implementations.
Figure 21:
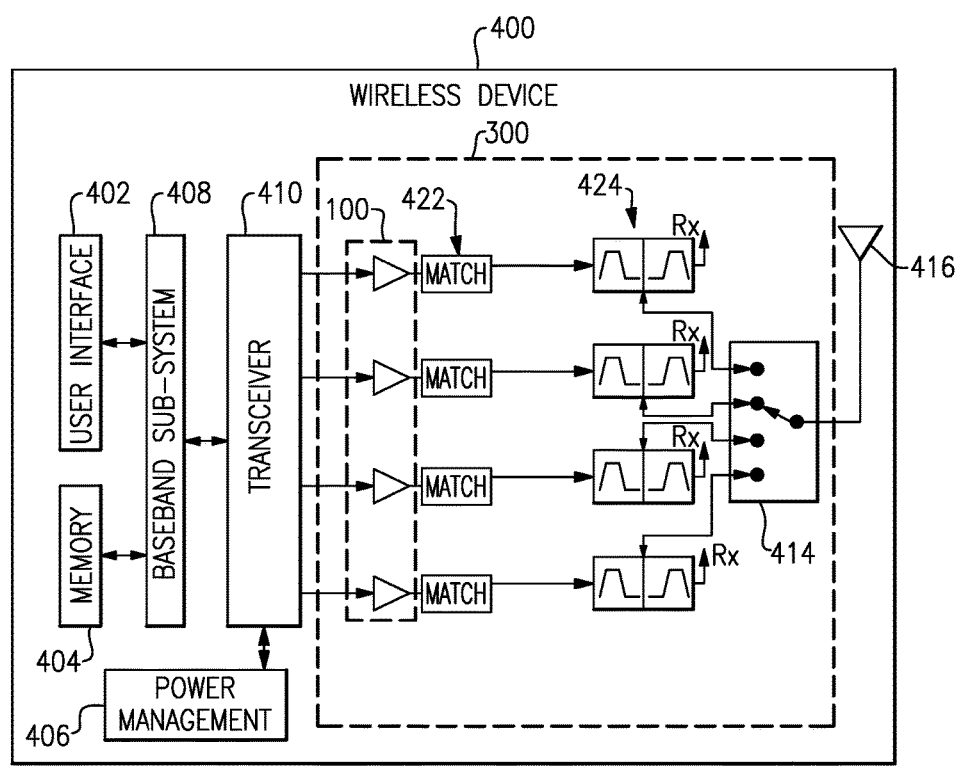
FIG. 21 is a schematic diagram of an example RF device according to some implementations.

FIG. 20 shows that in some embodiments, one or more features associated with a cascode architecture as described herein (e.g., the array 100 in FIGS. 6, 8, 10, and 11) can be implemented in a radio-frequency (RF) module. Such a module can be, for example, a front-end module (FEM). In the example of FIG. 21, a module 300 can include a packaging substrate 302, and a number of components can be mounted on such a packaging substrate. For example, a front-end power management integrated circuit (FE-PMIC) component 304, a power amplifier assembly 306, a match component 308, and a duplexer assembly 310 can be mounted and/or implemented on and/or within the packaging substrate 302. Other components such as a number of surface mount technology (SMT) devices 314 and an antenna switch module (ASM) 312 can also be mounted on the packaging substrate 302. In some implementations, the power amplifier assembly 306 includes the array 100 shown in FIGS. 6, 8, 10, and 11. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 21 depicts an example radio-frequency (RF) device 400 having one or more advantageous features described herein. In the context of a module having one or more features as described herein, such a module can be generally depicted by a dashed box 300, and can be implemented as, for example, a front-end module (FEM). Such a module can include an array 100 of cascoded devices as described herein.

Referring to FIG. 21, a power amplifier array 100 can receive their respective RF signals from a transceiver 410 that can be configured and operated in known manners to generate RF signals to be amplified and transmitted, and to process received signals. In some implementations, the power amplifier array 100 is similar to and adopted from the array 100 shown in FIGS. 6, 8, 10, and 11. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the RF device 400. In some implementations, the power management component 406 can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example RF device 400, outputs of the PA array 100 are shown to be matched (via respective match circuits 422) and routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 21, received signals are shown to be routed to "Rx" paths (not shown) that can include, for example, a low-noise amplifier (LNA).

In some implementations, the RF device 400 is a wireless device such as a cellular phone, laptop, tablet, wearable computing device, or the like. A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
   a plurality of pairs of transistors, each pair of transistors including a common emitter transistor and a common base transistor arranged in a cascode configuration, for each of the plurality of pairs of transistors, a base of the common base transistor being coupled to a single bias input, and for each of the plurality of pairs of transistors, an emitter of the common emitter transistor coupled to the base of the common base transistor through a bypass capacitance; and
   electrical connections implemented to connect the plurality of pairs in a parallel configuration between an input node and an output node, the electrical connections configured to distribute a collector current to all of the common base transistors.

2. The power amplifier of claim 1 wherein for each of the plurality of pairs of transistors, a base of the common emitter transistor is coupled to an input bias circuit.

3. The power amplifier of claim 2 wherein the input bias circuit includes a radio-frequency ballast resistance.

4. The power amplifier of claim 2 wherein the input bias circuit of the plurality of pairs of transistors are coupled to a common radio-frequency input.

5. The power amplifier of claim 1 wherein for each of the plurality of pairs of transistors, the emitter of the common emitter transistor is coupled to a ground potential.

6. The power amplifier of claim 1 wherein for each of the plurality of pairs of transistors, the base of the common base transistor is coupled to a cascode bias circuit.

7. The power amplifier of claim 6 wherein the cascode bias circuit includes a cascode ballast resistance.

8. The power amplifier of claim 1 wherein for each of the plurality of pairs of transistors, a collector of the common base transistor is coupled to a supply voltage.

9. The power amplifier of claim 1 wherein collectors of the common base transistors of the plurality of pairs of transistors are coupled to yield a common radio-frequency output.

10. A radio-frequency module comprising:
a packaging substrate configured to receive a plurality of components; and
a power amplification system implemented on the packaging substrate, the power amplification system including a power amplifier configured to receive and amplify a radio-frequency signal, the power amplifier including a plurality of pairs of transistors, each pair of transistors including a common emitter transistor and a common base transistor arranged in a cascode configuration, for each of the plurality of pairs of transistors, a base of the common base transistor being coupled to a single bias input, and for each of the plurality of pairs of transistors, an emitter of the common emitter transistor coupled to the base of the common base transistor through a bypass capacitance, the power amplifier further including electrical connections implemented to connect the plurality of pairs in a parallel configuration between an input node and an output node, the electrical connections configured to distribute a collector current to all of the common base transistors.

11. The radio-frequency module of claim 10 wherein for each of the plurality of pairs of transistors, a base of the common emitter transistor is coupled to an input bias circuit.

12. The radio-frequency module of claim 10 wherein for each of the plurality of pairs of transistors, the base of the common base transistor is coupled to a cascode bias circuit.

13. A radio-frequency device comprising:
a transceiver configured to generate a radio-frequency signal;
a front-end module in communication with the transceiver, the front-end module including a packaging substrate configured to receive a plurality of components, the front-end module further including a power amplifier configured to amplify the radio-frequency signal, the power amplifier including a plurality of pairs of transistors, each pair of transistors including a common emitter transistor and a common base transistor arranged in a cascode configuration, for each of the plurality of pairs of transistors, a base of the common base transistor being coupled to a single bias input, and for each of the plurality of pairs of transistors, an emitter of the common emitter transistor coupled to the base of the common base transistor through a bypass capacitance, the power amplifier further including electrical connections implemented to connect the plurality of pairs in a parallel configuration between an input node and an output node, the electrical connections configured to distribute a collector current to all of the common base transistors; and
an antenna in communication with the front-end module, the antenna configured to transmit the amplified radio-frequency signal.

14. The radio-frequency device of claim 13 wherein the radio-frequency device includes a wireless device.

15. The radio-frequency device of claim 14 wherein the wireless device includes a cellular phone.

16. The radio-frequency device of claim 13 wherein for each of the plurality of pairs of transistors, a base of the common emitter transistor is coupled to an input bias circuit.

17. The radio-frequency device of claim 13 wherein, for each of the plurality of pairs of transistors, the base of the common base transistor is coupled to a cascode bias circuit.

* * * * *